(12) United States Patent
Hur et al.

(10) Patent No.: US 7,145,196 B2
(45) Date of Patent: Dec. 5, 2006

(54) ASYMMETRIC FIELD EFFECT TRANSISTOR

(75) Inventors: Ki-Jae Hur, Seoul (KR); Kyung-Seok Oh, Seongnam-si (KR); Joo-Sung Park, Yongin-si (KR); Jung-Hyun Shin, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/003,612

(22) Filed: Dec. 2, 2004

(65) Prior Publication Data

US 2005/0127407 A1   Jun. 16, 2005

(30) Foreign Application Priority Data

Dec. 4, 2003   (KR) .................... 10-2003-0087772

(51) Int. Cl.
*H01L 27/108* (2006.01)
(52) U.S. Cl. ............... 257/296; 257/368; 257/344; 257/335; 257/336; 257/E29.279; 257/E21.427; 438/286; 438/249
(58) Field of Classification Search ............ 257/335, 257/336, 344, E29.279, E21.401, E21.427, 257/296; 438/179, 249, 163
See application file for complete search history.

(56) References Cited

U.S. PATENT DOCUMENTS

| | | | | |
|---|---|---|---|---|
| 5,648,286 A | * | 7/1997 | Gardner et al. ............. | 438/286 |
| 6,078,079 A | * | 6/2000 | Ogoh ......................... | 257/344 |
| 6,433,397 B1 | * | 8/2002 | Clevenger et al. .......... | 257/382 |
| 6,504,218 B1 | * | 1/2003 | Kadosh et al. .............. | 257/369 |
| 6,596,594 B1 | | 7/2003 | Guo ........................... | 438/279 |
| 6,670,682 B1 | * | 12/2003 | Mouli ........................ | 257/385 |
| 6,964,892 B1 | * | 11/2005 | Clevenger et al. .......... | 438/199 |
| 2001/0003034 A1 | * | 6/2001 | Furukawa et al. .......... | 430/313 |
| 2003/0218209 A1 | * | 11/2003 | D'Anna et al. ............. | 257/335 |
| 2005/0064689 A1 | * | 3/2005 | Mouli ........................ | 438/586 |

OTHER PUBLICATIONS

Korean Patent Application No. 990054916 to Jin et al., having Publication date of Jul. 2, 2001 (w/ English Abstract page).
Korean Patent Application No. 1020030015528 to Park, having Publication date of Feb. 25, 2003 (w/ English Abstract page).

* cited by examiner

*Primary Examiner*—Jerome Jackson
*Assistant Examiner*—Paul Budd
(74) *Attorney, Agent, or Firm*—Monica H. Choi

(57) ABSTRACT

A field effect transistor includes a channel region under a gate stack formed on a semiconductor structure. The field effect transistor also includes a drain region formed with a first dopant doping a first side of the channel region, and includes a source region formed with the first dopant doping a second side of the channel region. The drain and source regions are doped asymmetrically such that a first charge carrier profile between the channel and drain regions has a steeper slope than a second charge carrier profile between the channel and source regions.

12 Claims, 15 Drawing Sheets

ASYMMETRIC FIELD EFFECT TRANSISTOR

BACKGROUND OF THE INVENTION

This patent application claims priority from Korean Patent Application No. 2003-0087772, filed on Dec. 4, 2003, which is hereby incorporated by reference in its entirety.

FIELD OF THE INVENTION

The present invention relates generally to integrated circuits, more particularly, to a field effect transistor with asymmetric drain and source regions for enhanced performance of the field effect transistor especially within a memory cell.

DESCRIPTION OF THE RELATED ART

A field effect transistor such as a MOSFET (metal oxide semiconductor field effect transistor) is commonly used for many integrated circuits. For example, in a DRAM (dynamic random access memory) cell, a source or drain region of an access MOSFET has a pad disposed thereon with such a pad being coupled to a charge storage node of a charge storage capacitor. The pad is disposed onto substantially the whole area of the source or drain region for efficient charge transfer between the MOSFET and the charge storage node.

In the prior art, the source and drain regions each have a LDD (lightly doped drain) area toward the channel region. Such a LDD area creates a gently-sloped dopant profile between a source or drain region and the channel region. Thus, the LDD area reduces intensities of electric fields and thus undesired short channel effects in the MOSFET. However, such a LDD area limits efficient charge transfer between the MOSFET and the charge storage node of the charge storage capacitor, especially as the device size of the MOSFET is further scaled down.

U.S. Pat. No. 6,596,594 to Jyh-Chyurn Guo (hereafter referred to as "Guo") discloses a method for fabricating a field effect transistor (FET) with an asymmetric channel region and asymmetric source and drain regions using five implantation steps. In Guo, the drain region has an implantation mask formed thereon for preventing implantation of dopant therein during some of the five implantation steps such that the source region has higher doping. Unfortunately, Guo has increased production cost with so many implantation steps.

Nevertheless, forming an asymmetric field effect transistor with higher doping in one of the drain and source regions is desired for enhanced performance of the field effect transistor.

SUMMARY OF THE INVENTION

Accordingly, the present invention discloses an asymmetric field effect transistor formed without such a large number of implantation steps.

According to an aspect of the present invention, a field effect transistor includes a gate stack formed on a semiconductor substrate for forming a channel region under the gate stack. In addition, the field effect transistor includes a drain region formed with a first dopant doping a first side of the channel region, and includes a source region formed with the first dopant doping a second side of the channel region. The drain and source regions are doped asymmetrically such that a first charge carrier profile between the channel and drain regions has a steeper slope than a second charge carrier profile between the channel and source regions.

In an example embodiment of the present invention, a drain pad is formed over the drain region, and a source pad is formed over the source region. The drain and source pads are doped with the first dopant. Thereafter, the drain and source region are formed with the first dopant that diffuses from the drain and source pads into the drain and source regions, respectively.

In a further embodiment of the present invention, an opening is patterned over the drain pad, and the first dopant is implanted into the drain pad through the opening to form an impurity region within the drain pad. Thereafter, the first dopant from the impurity region diffuses to the drain region to further dope the drain region.

In yet another embodiment of the present invention, an opening is formed over the source pad, and a second dopant having opposite conductivity from the first dopant is implanted through the opening to form an impurity region within at least a portion of the source pad. The second dopant from the impurity region diffuses to the source region to dope the source region. In an example embodiment of the present invention, such a first dopant has N-type conductivity, and such a second dopant has P-type conductivity.

The present invention may be used to particular advantage when the drain pad is coupled to a charge storage node of a charge storage capacitor within a DRAM (dynamic random access memory) cell. The steeper charge carrier profile between the channel and drain regions advantageously results in more efficient charge transfer between the field effect transistor and the charge storage node of the capacitor within the DRAM cell.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, and 17 refer to elements having similar structure and/or function.

DETAILED DESCRIPTION OF THE INVENTION

Figure 1:
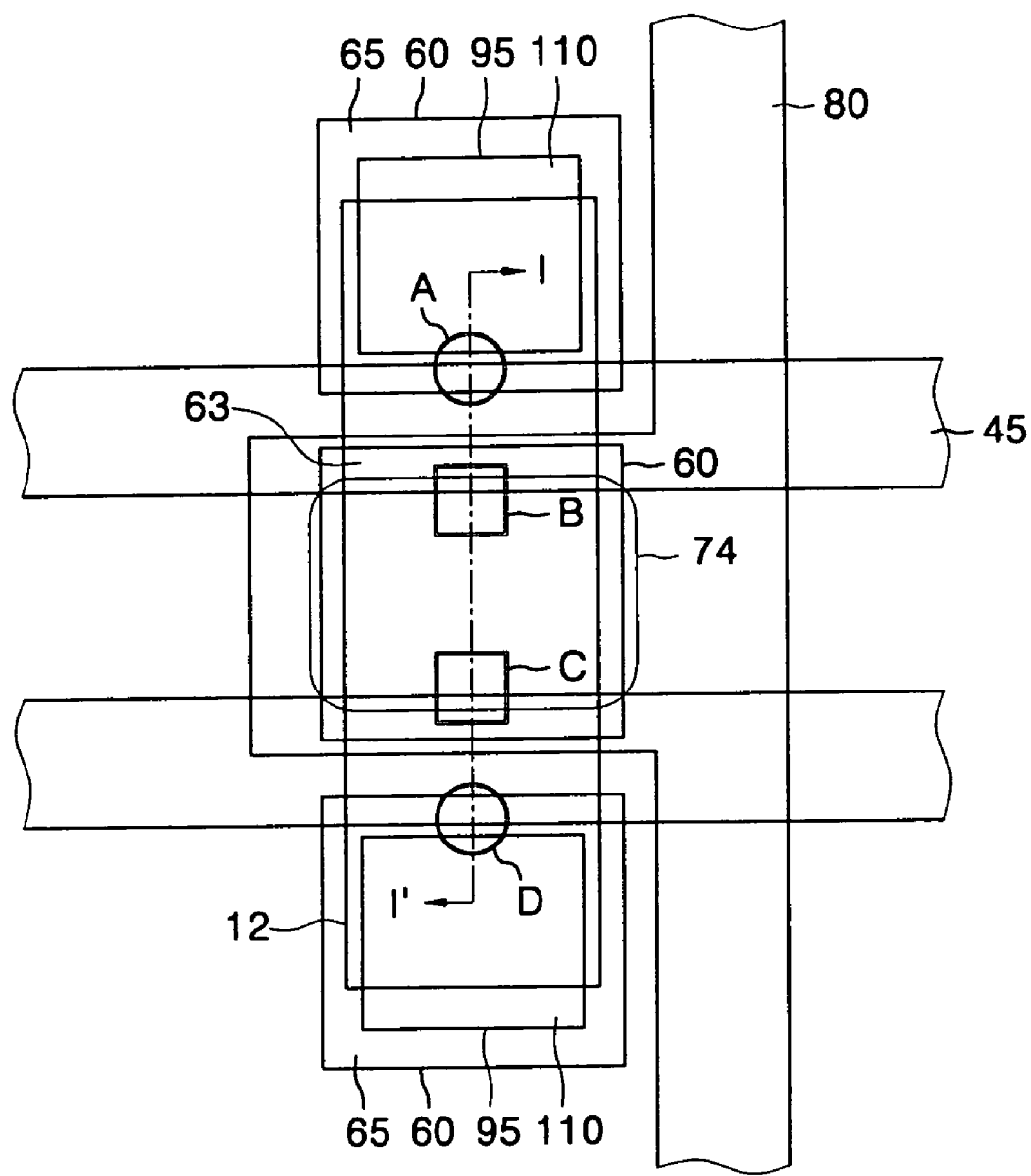
FIG. 1 shows a layout of asymmetric field effect transistors formed according to an embodiment of the present invention.
Figure 2:
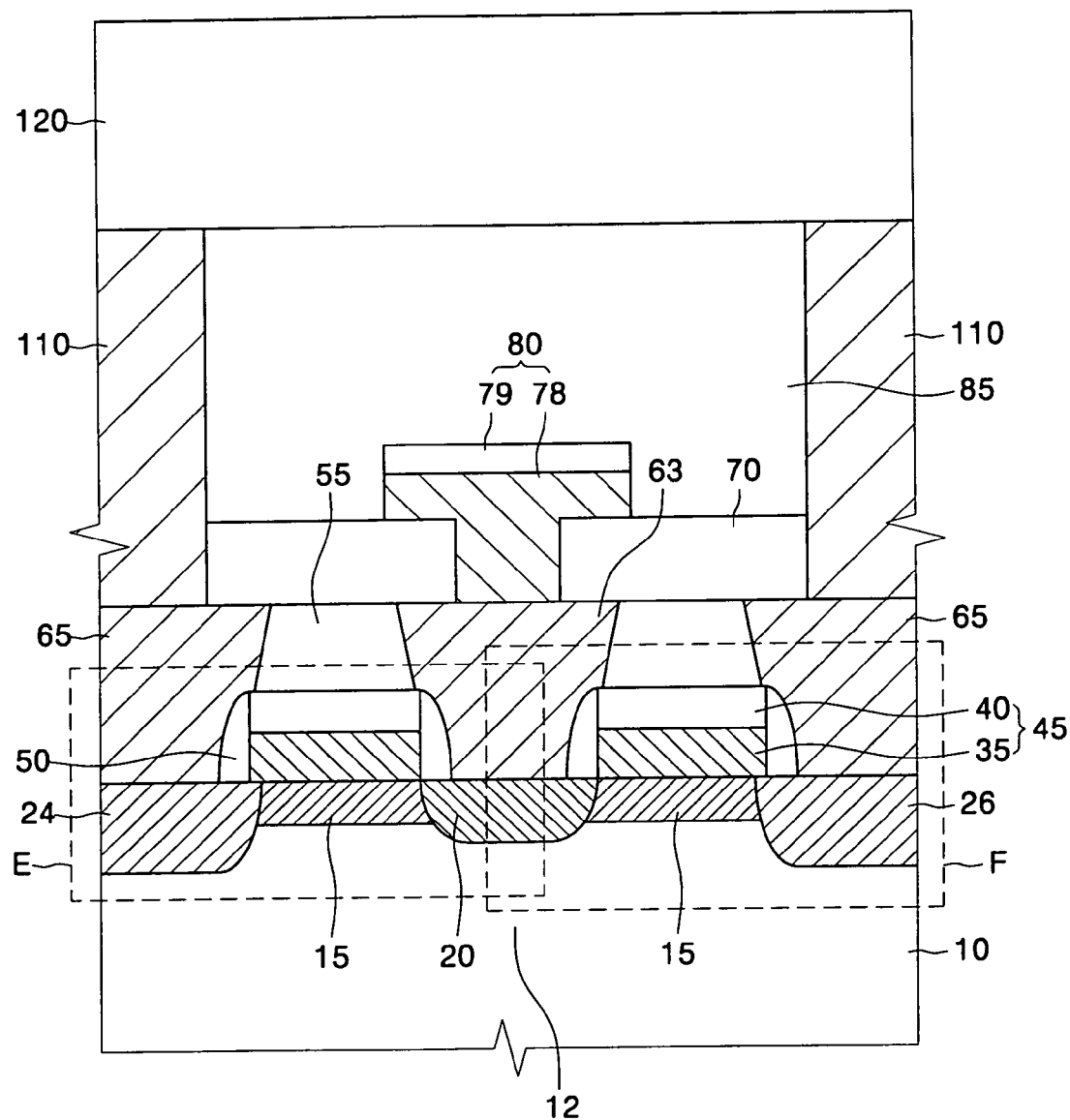
FIG. 2 is a cross-sectional view along line I–I' of FIG. 1, according to a first embodiment of the present invention.

FIG. 1 shows a layout of asymmetric field effect transistors formed according to an embodiment of the present invention. FIG. 2 is a cross-sectional view along line I–I' of FIG. 1, according to a first embodiment of the present invention.

Referring to FIGS. 1 and 2, two adjacent gate stacks 45 are disposed on an active region 12 of a semiconductor substrate 10. In one example application, the asymmetric field effect transistors are formed as part of a DRAM (dynamic random access memory) device. Each gate stack 45 forms a field effect transistor such as a MOSFET (metal oxide semiconductor field effect transistor).

Further referring to FIGS. 1 and 2, gate spacers 50 are disposed on the sidewalls of each gate stack 45. A channel region 15 is disposed under each gate stack 45. A source region 20 is disposed between the two channel regions 15, and drain regions 24, 26 are each disposed at a side of one of the channel regions 15, within the semiconductor substrate 10.

The drain regions 24, 26 and the source region 20 are doped with an N-type dopant. Each of the drain regions 24, 26 has greater concentration of majority charge carriers than the source region 20 such that the field effect transistors for the gate stacks 45 is asymmetric. In addition, each of the drain regions 24, 26 is greater in size having greater depth than the source region 20.

Each gate stack 45 includes a gate 35 and a gate capping layer 40 stacked thereon. In addition, each gate stack 45 includes a gate dielectric (not shown in FIG. 2 for simplicity of illustration) comprised of an insulating material disposed between the gate 35 and the channel region 15.

The gate stacks 45 and the gate spacers 50 are covered with a pad interlayer insulating layer 55. In addition, source and drain pads 63, 65 are formed through the pad interlayer insulating layer 55 between the gate stacks 45 to contact the source and drain regions 20, 24, and 26. The pad interlayer insulating layer 55 is comprised of an insulating material, in one embodiment of the present invention. The source and drain pads 63, 65 are comprised of polysilicon doped with an N-type dopant, in one embodiment of the present invention.

A pattern interlayer insulating layer 70 is formed to cover the source and drain pads 63, 65. A source pattern 80 is formed with a source line 78 formed through the pattern interlayer insulating layer 70 to contact the source pad 63. A source line capping layer 79 is stacked on the source line 78.

A buried interlayer insulating layer 85 covers the source pattern 80, and drain patterns 110 are formed through the buried interlayer insulating layer 85 and the pattern interlayer insulating layer 70 to contact the drain pads 65. The buried interlayer insulating layer 85 is comprised of an insulating material having the same etch selectivity as the pattern interlayer insulating layer 70, and the drain patterns 110 are comprised of polysilicon doped with an N-type dopant, in one embodiment of the present invention. A diffusion interlayer insulating layer 120 covers the drain patterns 110 and is comprised of at least one insulating layer having the same etch selectivity as the buried interlayer insulating layer 85, in one embodiment of the present invention.

Further referring to FIG. 2, two adjacent field effect transistors E, F are formed with the source and drain regions 20, 24, 26, the gate stacks 45, and the gate spacers 50. The left transistor E is formed with the source region 20 and the drain region 24 disposed under both ends of the left gate stack 45. The right transistor F is formed with the source region 20 and the drain region 26 disposed under both ends of the right gate stack 45. Each of the drain regions 24 and 26 are formed asymmetrically from the source region 20.

Figure 3:
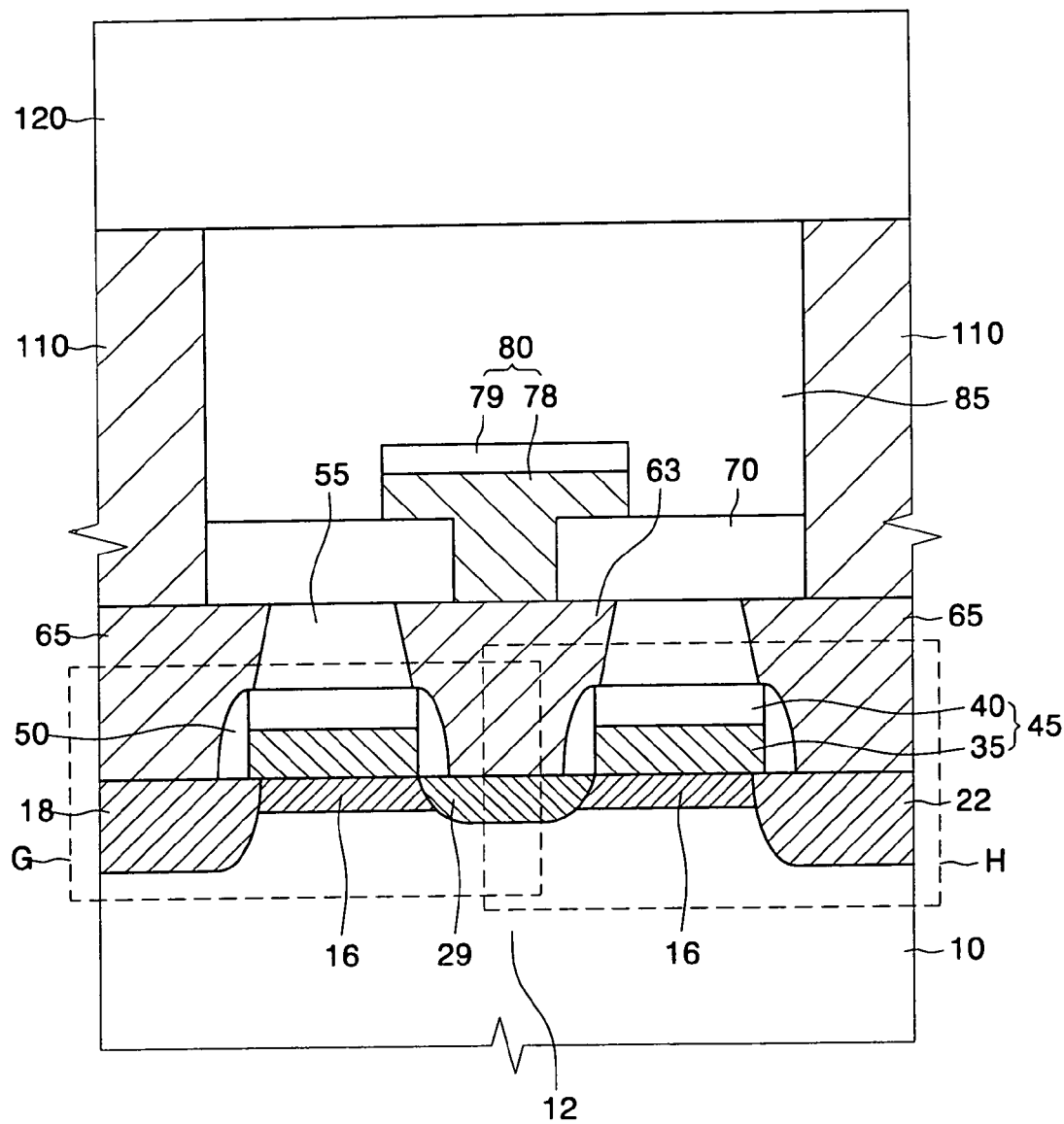
FIG. 3 is a cross-sectional view along line I–I' of FIG. 1, according to a second embodiment of the present invention.

FIG. 3 is a cross-sectional view along line I–I' of FIG. 1, according to a second embodiment of the present invention. Elements having the same reference number in FIGS. 1, 2, and 3 refer to elements having similar structure and/or function. However, channel regions 16 under the gate stacks 45 and a source region 29 in FIG. 3 have lower depth than the channel region 15 and the source region 20, respectively, of FIG. 2. Similar to FIG. 2, diffusion regions 18, 22 of FIG. 3 have higher dopant concentration and greater size than the source region 29 for forming asymmetric field effect transistors.

In FIG. 3, the drain regions 18, 22, and the source region 29 are doped with an N-type dopant, but an additional P-type dopant is added to the source region 29. The drain and source regions 18, 22, and 29 have N-type majority charge carriers. However, the concentration of the N-type majority charge carriers is decreased in the source region 29 by adding P-type dopant to the source region 29 in FIG. 3. Thus, the field effect transistors of FIG. 3 are asymmetric.

Further referring to FIG. 3, two adjacent field effect transistors G, H are formed with the source and drain regions 29, 18, 22, the gate stacks 45, and the gate spacers 50. The left field effect transistor G is formed with the source region 29 and the drain region 18 disposed under both ends of the left gate stack 45. The right field effect transistor H is formed with the source region 29 and the drain region 22 disposed under both ends of the right gate stack 45.

FIGS. 4, 5, 6, 7, 8, 9, and 10 are cross-sectional views along line I–I' of FIG. 1 illustrating steps for fabricating the asymmetric field effect transistors E and F for the first embodiment of the present invention. Elements having the same reference number in FIGS. 1, 2, 4, 5, 6, 7, 8, 9, and 10 refer to elements having similar structure and/or function.

Figure 4:
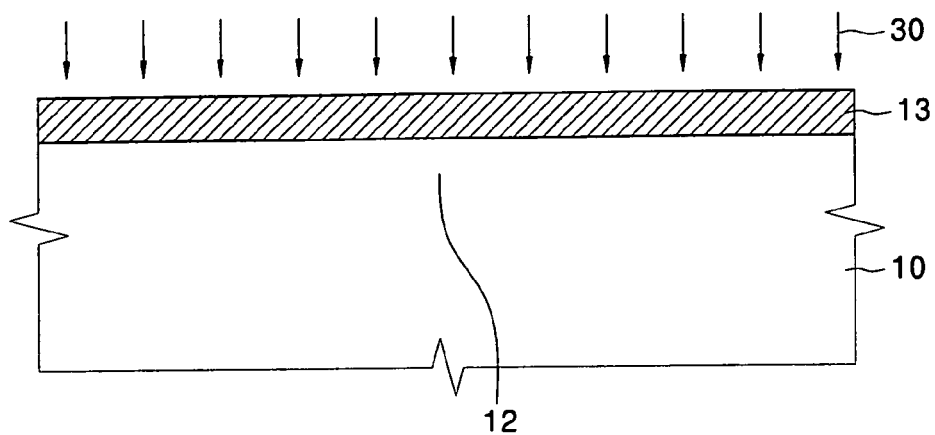
FIGS. 4, 5, 6, 7, 8, 9, and 10 are cross-sectional views along line I–I' of FIG. 1 illustrating steps for fabricating asymmetric field effect transistors for the first embodiment of the present invention.

Referring to FIG. 4, an ion implantation process is performed for implanting a channel dopant into the active region 12 of the semiconductor substrate 10. The channel dopant has P-type conductivity with the semiconductor substrate 12 also being doped for P-type conductivity. Further referring to FIG. 4, the implantation process for implanting the channel dopant uses an energy of 30~50 KeV and a dose of $1 \times 10^{12} \sim 1 \times 10^{14}/\text{cm}^2$. In an example embodiment of the present invention, the channel dopant is comprised of at least one of B and $BF_2$.

In one embodiment of the present invention, the active region 12 is for a DRAM cell array region when the asymmetric field effect transistors are formed for a DRAM (dynamic random access memory) device. However, the asymmetric field effect transistor of the present invention may be formed for other types of integrated circuits.

Figure 5:
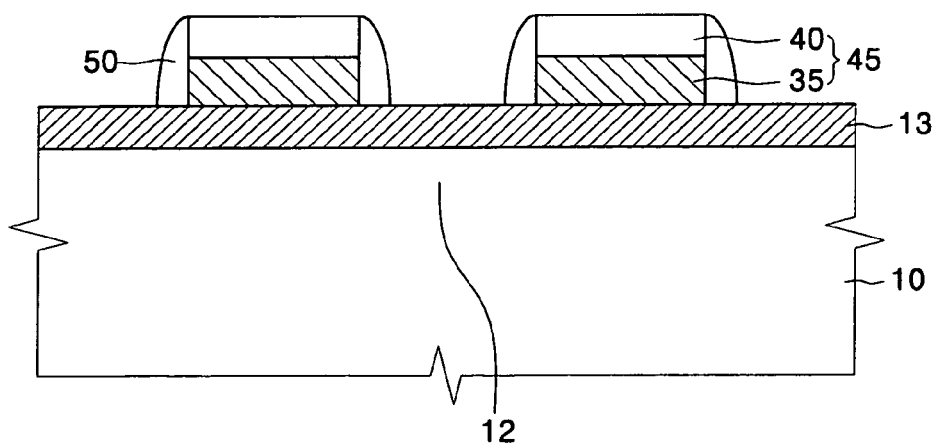

Further referring to FIG. 4, implantation of the channel dopant defines a channel ion region 13 downward from the top surface of the semiconductor substrate 10 to a predetermined depth. Referring to FIGS. 4 and 5, the two adjacent gate stacks 45 are formed on the active region 12 having the channel ion region 13. In addition, the gate spacers 50 are formed on the sidewalls of each of the gate stacks 45.

Each of the gate stacks 45 includes a gate 35 and a gate capping layer 40 stacked thereon. In addition, each gate stack 45 includes a gate dielectric (not shown in FIGS. 2, 5, 6, 7, 8, 9, and 10 for simplicity of illustration) comprised of an insulating material disposed between the gate 35 and the channel region 15.

The gate 35 is comprised of polysilicon doped with an N-type dopant, or is comprised of doped polysilicon with metal silicide stacked thereon, in one embodiment of the present invention. Alternatively, the gate 35 is comprised of a refractory or noble metal having a high melting point. The gate capping layer 40 is comprised of silicon nitride, in one embodiment of the present invention. The gate spacers 50 are comprised of an insulating material having the same etch selectivity as the gate capping layer 40.

Figure 6:
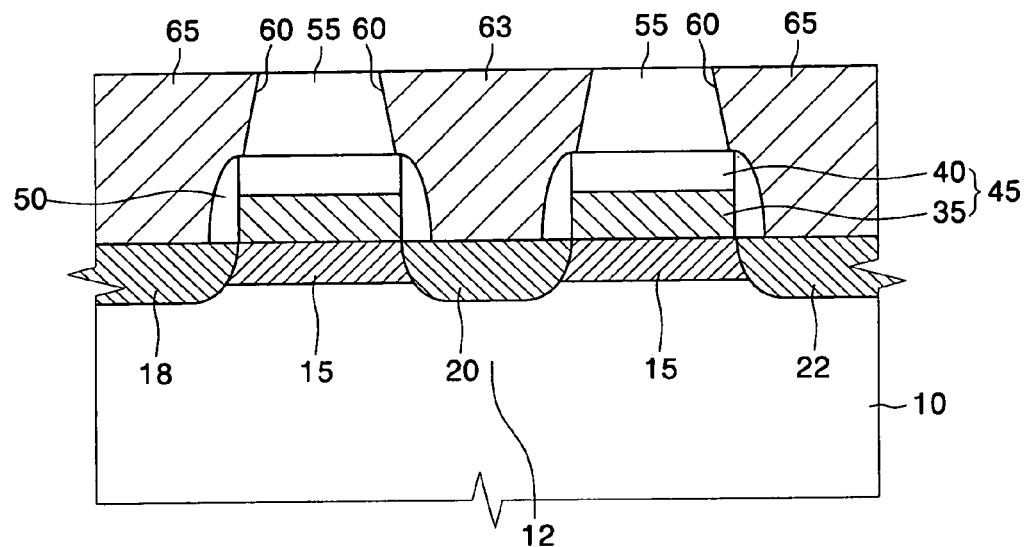

Referring to FIGS. 5 and 6, a pad interlayer insulating layer 55 is formed to surround the gate stacks 45. Pad contact holes 60 are formed through the pad interlayer insulating layer 55 to expose the semiconductor substrate to the sides of the gate stacks 45. A source pad 63 and drain pads 65 are formed to fill the pad contact holes 60.

The source and drain pads 63, 65 are comprised of polysilicon doped with an N-type dopant having a dopant concentration higher than that of the channel ion region 13. For example, the source and drain pads 63, 65 are comprised of polysilicon doped with $1 \times 10^{20} \sim 10 \times 10^{22}/cm^3$ of phosphorous (P) that is N-type, whereas the P-type dopant concentration within the channel ion region 13 is below $10 \times 10^{18}/cm^3$. Thereafter, the dopant diffuses from the source and drain pads 63, 65 into the semiconductor substrate 10 to form the source and drain regions 20, 18, and 22, especially when the structures of FIG. 6 are heated up.

At this point, the source and drain regions 20, 18, and 22 have a same majority charge carrier concentration K. The majority charge carriers are of N-type conductivity within the source and drain regions 20, 18, and 22, in one embodiment of the present invention. The source and drain regions 20, 18, and 22 are disposed to sides of the channel regions 15. The majority charge carriers within the channel regions 15 have P-type conductivity with a concentration M. The pad interlayer insulating layer 55 is comprised of an insulating material having an etch selectivity different from the gate spacer 50.

Figure 7:
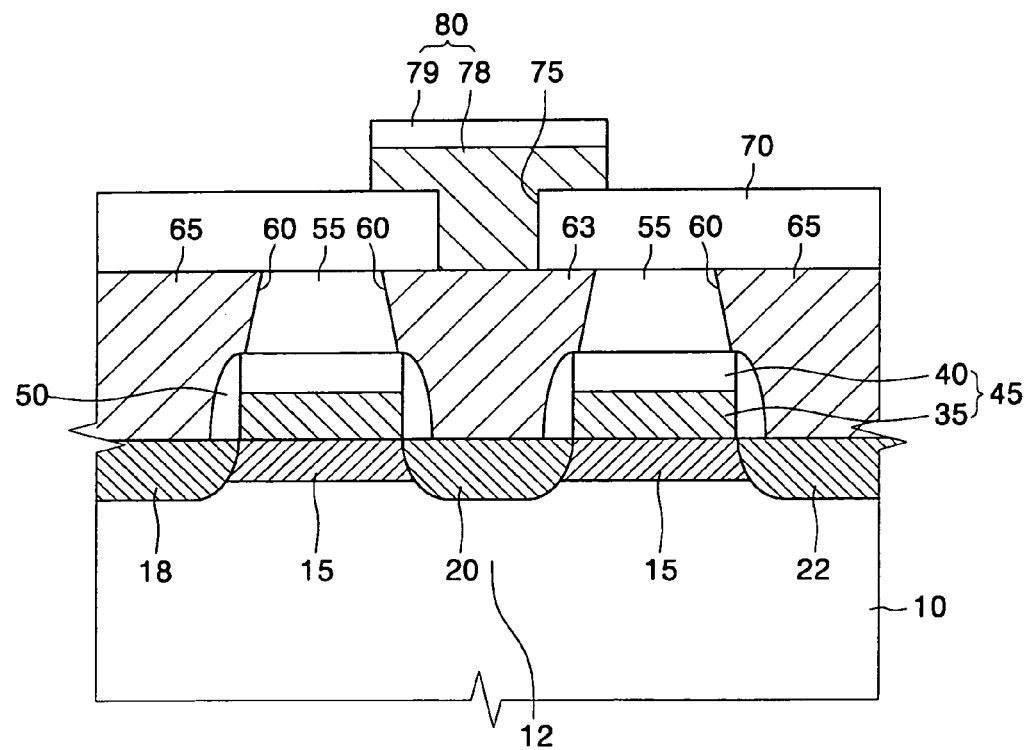

Referring to FIG. 7, a pattern interlayer insulating layer 70 is deposited after FIG. 6, and a pattern contact hole 75 is formed through the pattern interlayer insulating layer 70 to expose the source pad 63. A source pattern 80 is formed on the pattern interlayer insulating layer 70 with the source line 78 filling the pattern contact hole 75. The source line 78 has the source line capping layer pattern 79 stacked thereon.

The source line 78 is comprised of polysilicon doped with an N-type dopant, or is comprised of doped polysilicon with metal silicide stacked thereon, in one embodiment of the present invention. Alternatively, the source line 78 is comprised of a refractory or noble metal having a high melting point. The source line capping layer 79 is comprised of an insulating material having the same etch selectivity as the gate capping layer 40. The pattern interlayer insulating layer 70 is comprised of an insulating material having the same etch selectivity as the pad interlayer insulating layer 55.

Figure 8:
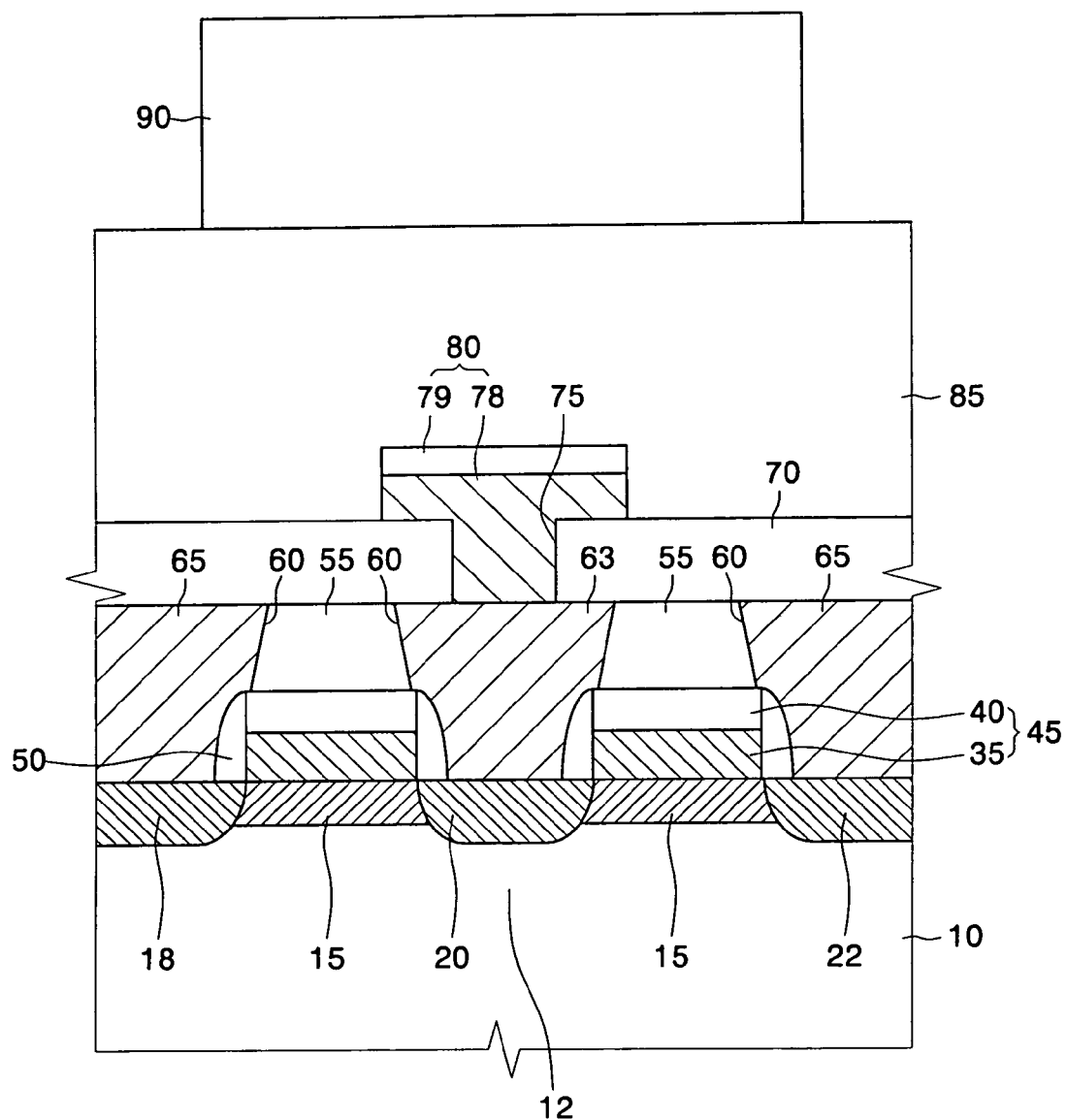

Referring to FIG. 8, a buried interlayer insulating layer 85 is deposited after FIG. 7. The buried interlayer insulating layer 85 is comprised of an insulating material having the same etch selectivity as the pattern interlayer insulating layer 70. Further referring to FIG. 8, a photoresist material 90 is patterned on the buried interlayer insulating layer 85.

Figure 9:
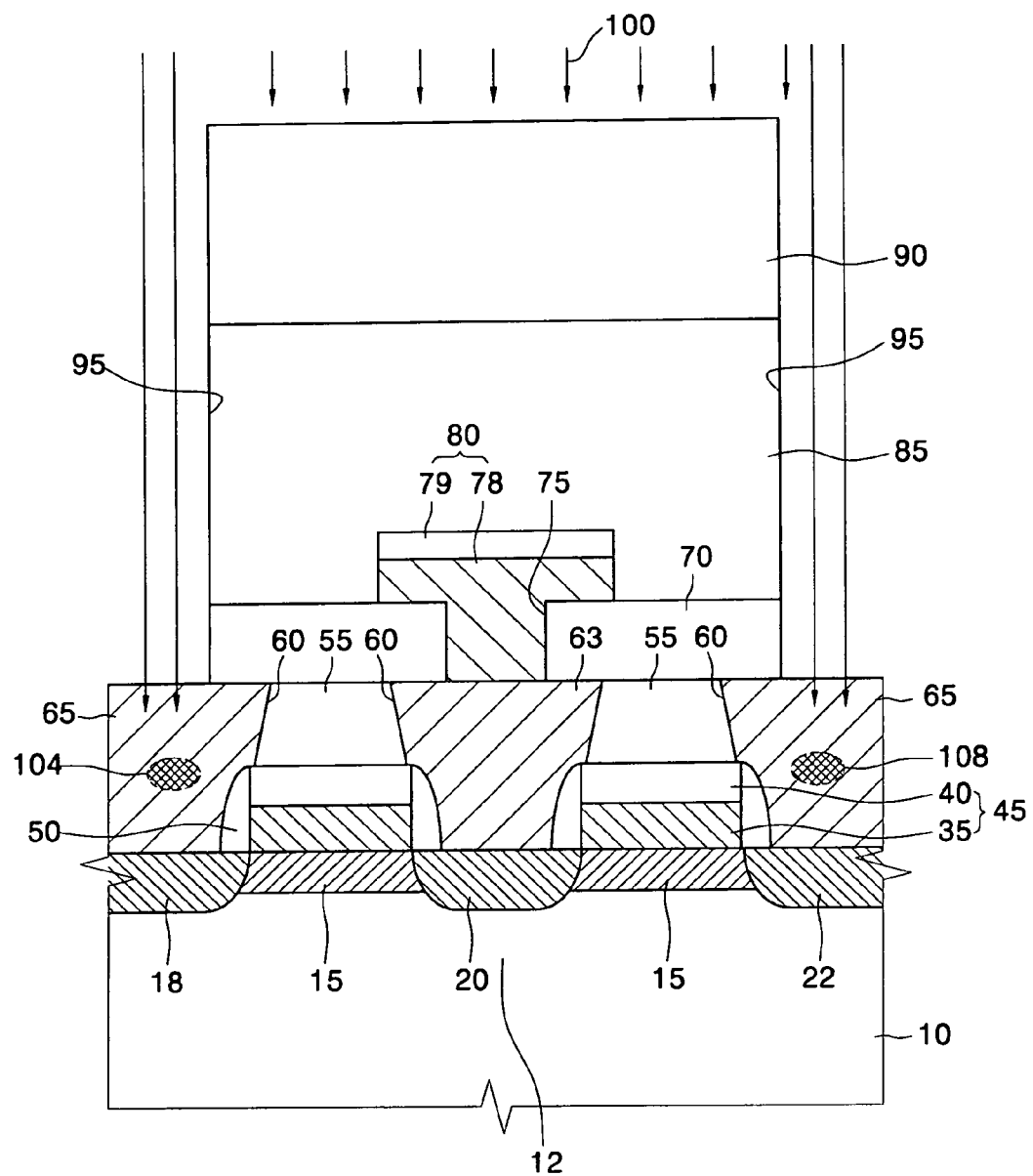

Referring to FIGS. 8 and 9, portions of the buried interlayer insulating layer 85 and the pattern interlayer insulating layer 70 not under the photoresist are etched away to form buried contact holes 95 which expose the drain pads 65. Further referring to FIG. 9, an ion implantation process 100 is performed with the photoresist 90 acting as an implantation mask. During this ion implantation process a dopant with N-type conductivity such as phosphorous (P) or arsenic (As) is implanted through the buried contact holes 95 into the drain pads 65 to form impurity regions 104 and 108 within the drain pads 65.

In the case of phosphorous (P) being implanted for forming the impurity regions 104, 108, the implantation energy is controlled such that the implantation projection range (Rp) results in the impurity regions 104, 108 being formed within the drain pads 65. Alternatively, in the case of arsenic (As) being implanted for forming the impurity regions 104, 108, the implantation energy is controlled such that the implantation projection range (Rp) results in the impurity regions 104, 108 being formed near the top surface of the semiconductor substrate 10, or in the diffusion drain regions 18, 22 of the substrate 10.

In one embodiment of the present invention, the ion implantation process 100 of FIG. 9 is performed with a tilt angle of 0° with respect to a line normal to the top surface of the semiconductor substrate 10. After the ion implantation process 100, the photoresist 90 is removed from the semiconductor substrate 10. Alternatively, the ion implantation process 100 is performed using the buried interlayer insulating layer 85 as an implantation mask after removing the photoresist 90 from the semiconductor substrate 10.

Figure 10:
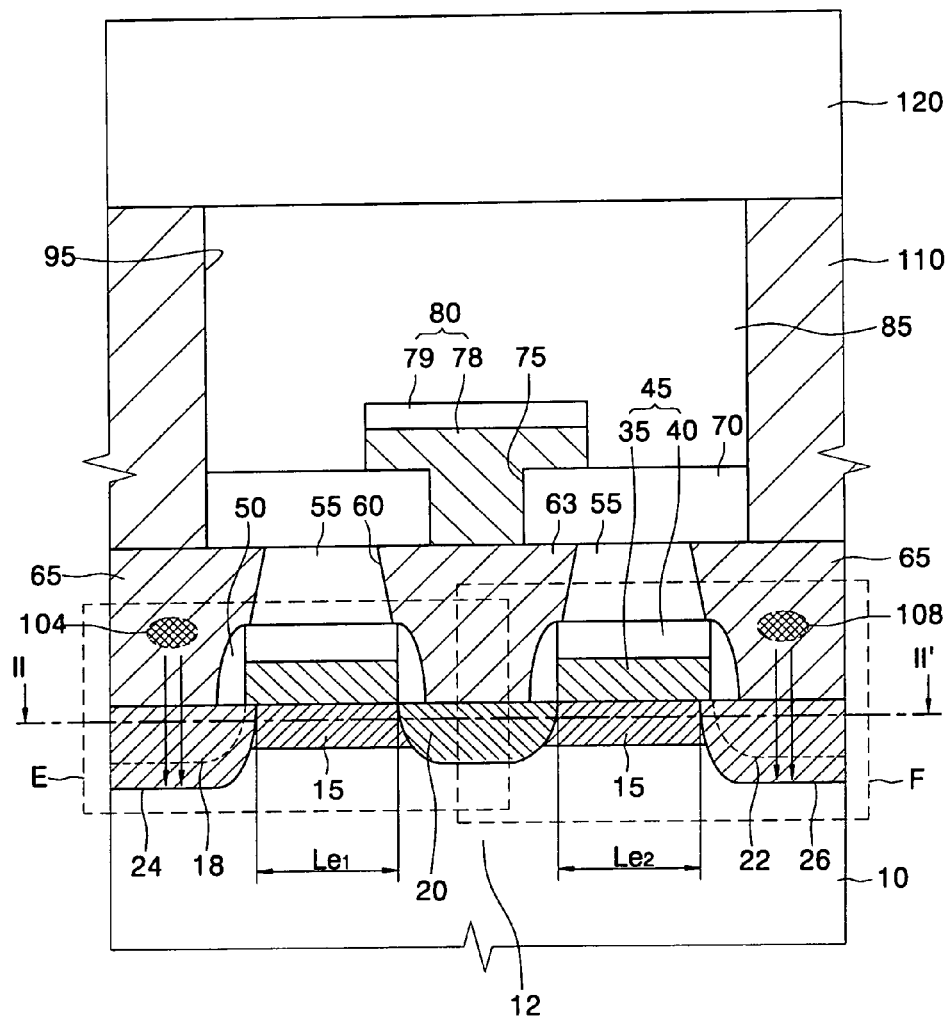

Referring to FIG. 10, drain patterns 110 are formed to fill the buried contact holes 95 and to contact the drain pads 65. Each drain pattern 110 and drain pad 65 coupled together are also coupled to a charge storage node of a charge storage capacitor of a DRAM (dynamic random access memory) cell when the asymmetric field effect transistors are used within a DRAM device.

A diffusion interlayer insulating layer 120 is deposited on the drain patterns 110 and the buried interlayer insulating layer 85. The diffusion interlayer insulating layer 120 is comprised of at least one insulating layer in one embodiment of the present invention.

Further referring to FIG. 10, the N-type dopant within the impurity regions 104, 108 diffuse into the drain regions 18, 22 especially when the structures of FIG. 10 are heated up during formation of the drain patterns 110 and the diffusion interlayer insulating layer 120. Thus, the N-type dopant from the impurity regions 104, 108 further dopes the drain regions 18, 22 to form deeper drain regions 24, 26, respectively. With such additional doping, the deeper drain regions 24, 26 also have higher concentration J of the N-type majority charge carriers than the initial drain regions 18, 22 and the source region 20.

Consequently, the source region 20 is formed to be smaller having a shallower depth than the drain regions 24, 26 resulting in asymmetric field effect transistors E and F in FIG. 10. Further referring to FIG. 10, the two adjacent asymmetric transistors E, F, have effective channel lengths $L_{e1}$, $L_{e2}$, respectively that are each smaller than the width of the gate stack 45 as the drain and source regions 24, 26, and 20 diffuse inward toward the channel region 15 to be under the gate stack 45 at the ends of the gate stack 45. The effective channel lengths $L_{e1}$, $L_{e2}$ for the transistors E, F, respectively, are substantially equal in one embodiment of the present invention.

Figure 11:
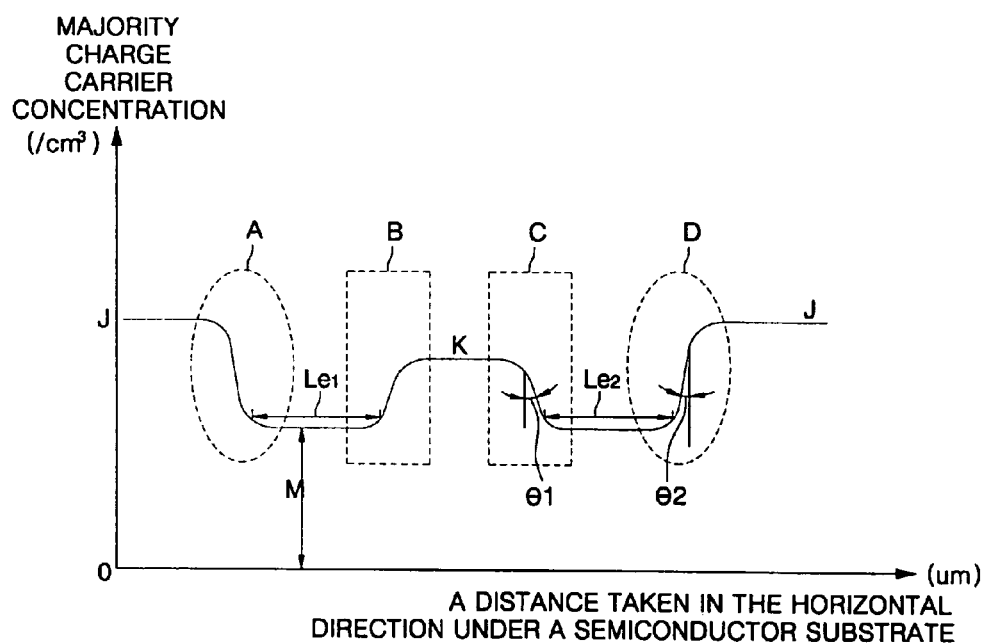
FIG. 11 is a profile of majority charge carrier concentration along line II–II' of FIG. 10.

FIG. 11 is a profile of majority charge carrier concentration along line II–II' of FIG. 10 including across the source and drain regions 20, 24, and 26 and the channel regions 15. The drain regions 24, 26 have a majority N-type charge carrier concentration J, and the source region 20 has a majority N-type charge carrier concentration K that is less than J. The channel regions 15 have a majority P-type charge carrier concentration M which is lower than K and J.

Portions A, B, C, and D in the profile of FIG. 11 are each an area of transition from one of the source and drain regions 20, 24, and 26 to a channel region 15 under a gate stack 45. Such portions A, B, C, and D each have a slope for transitioning between the different majority charge carrier concentrations. For example, in the portions A and D, the transition from concentration J to concentration M results in a slope of the profile forming an angle, $\theta_2$, with respect to the vertical axis. Alternatively, in the portions B and C, the transition from concentration K to concentration M results in a slope of the profile forming an angle, $\theta_1$, with respect to the vertical axis.

Because J is higher than K, the angle $\theta_2$ in the portions A and D (having a steeper slope) is smaller than the angle $\theta_1$ in portions B and C. As a result, referring to FIGS. 10, 11, and 17, each of the drain regions 24, 26 has higher majority carrier concentration fully abutting the drain pad 65 coupled to a charge storage node 204 of a charge storage capacitor 200 for more efficient charge transfer between the field effect transistor E and the charge storage capacitor 200. In addition with such drain regions 24, 26 having higher majority carrier concentration abutting the drain pad 65, data charge stored in the capacitor 200 may be maintained longer.

Figure 17:
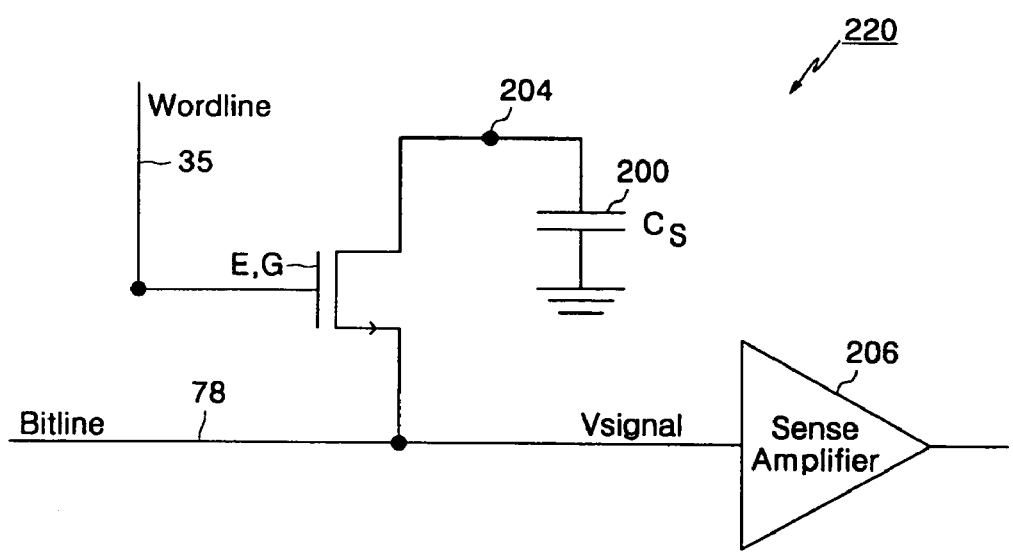
FIG. 17 illustrates coupling a drain region of an asymmetric field effect transistor to a charge storage node within a DRAM cell.

FIG. 17 illustrates the example asymmetric field effect transistor E being formed as part of a DRAM (dynamic random access memory) cell 220. In that case, the field effect transistor E is an access transistor with the drain region 24 coupled to the charge storage node 204 of the charge storage capacitor 200 via the drain pad 65. The source-line 78 is coupled to a bit-line for the DRAM cell 220, and the gate 35 is coupled to the word-line for the DRAM cell 220. A sense amplifier 206 is used for sensing the data charge stored in the capacitor 200.

Figure 12:
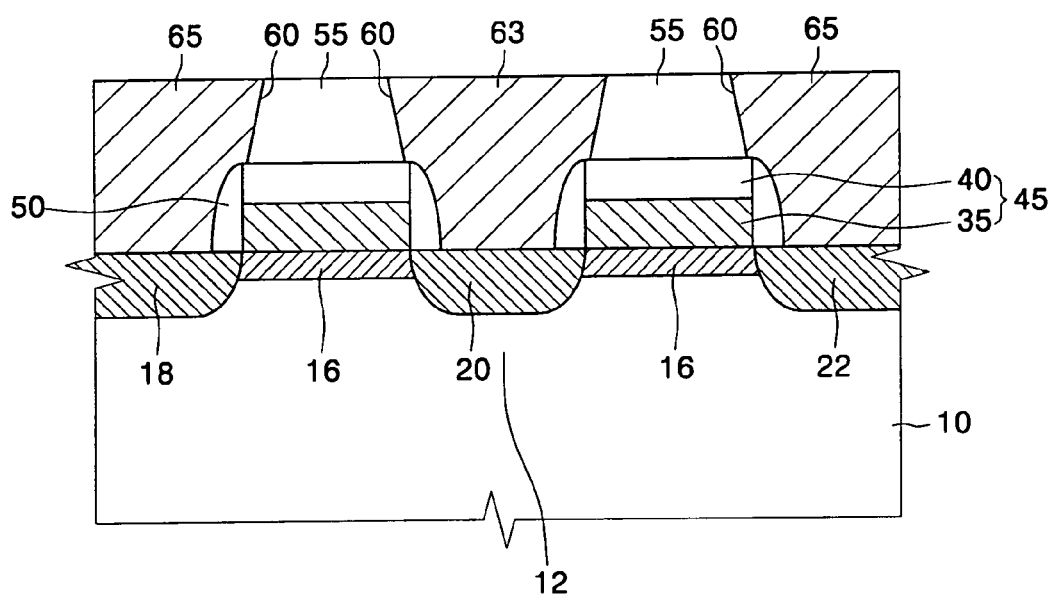
FIGS. 12, 13, 14, and 15 are cross-sectional views along line I–I' of FIG. 1 illustrating steps for fabricating asymmetric field effect transistors for the second embodiment of the present invention.

FIGS. 12, 13, 14, and 15 are cross-sectional views along line I–I' of FIG. 1 illustrating steps for fabricating asymmetric field effect transistors for the second embodiment of the present invention. Referring to FIGS. 6 and 12, elements having the same reference number in FIGS. 6 and 12 refer to elements having similar structure and/or function. However, the channel region 16 of FIG. 12 is formed to be shallower than the channel region 15 of FIG. 6 when the P-type dopant for forming the channel region 16 in FIG. 12 is implanted with a lower implantation energy of 20~30 KeV and a dose of $1\times10^{12} \sim 1\times10^{14}/cm^2$. Such a P-type dopant doping the channel region 16 is comprised of at least one of B and $BF_2$, in one embodiment of the present invention.

Similar to FIG. 6, the source and drain regions 20, 18, and 22 are formed with the N-type dopant diffusing from the source and drain pads 63, 65 into the semiconductor substrate 10 in FIG. 12. Thus in FIG. 12, the source region 20 is symmetric with the drain regions 18 and 22, and the source and drain regions 20, 18, and 22 have a majority N-type charge carrier concentration K.

Figure 13:
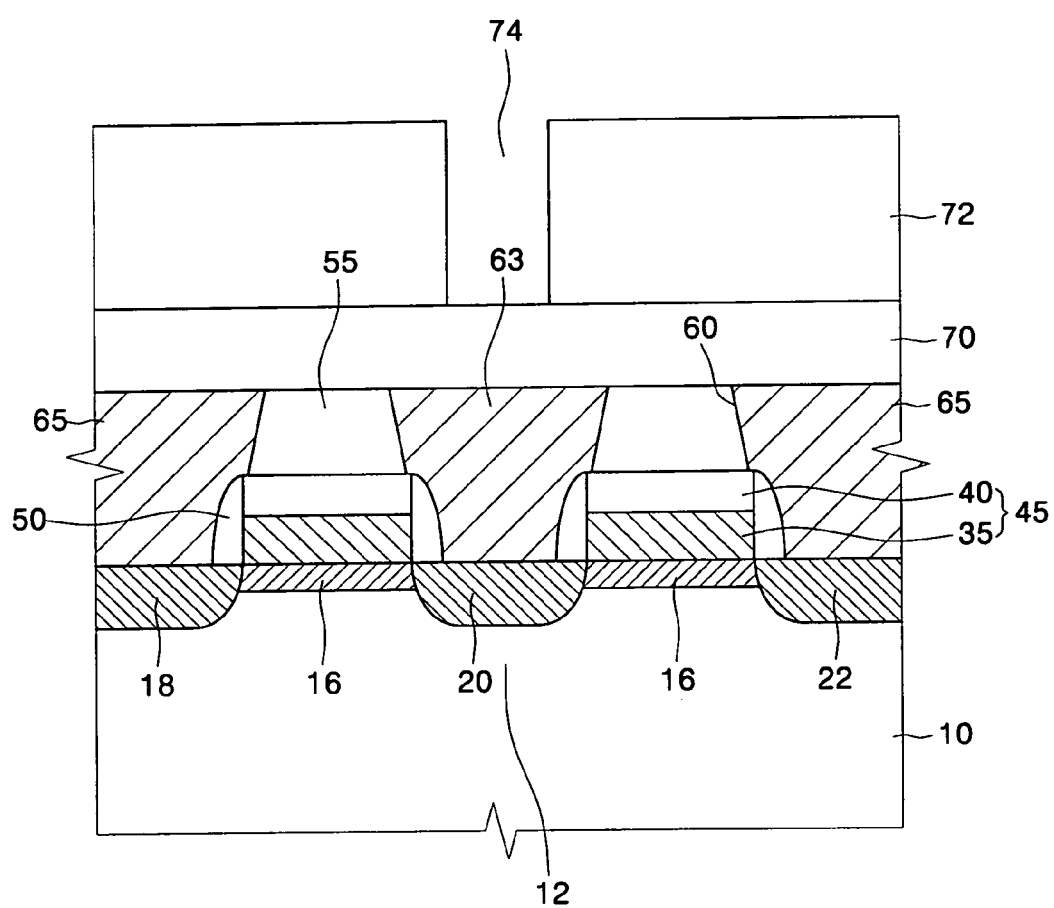

Referring to FIGS. 12 and 13, a pattern interlayer insulating layer 70 and a photoresist layer 72 are sequentially deposited, and the photoresist layer 72 is patterned to form a pattern hole 74. Using the photoresist layer 72 as an etch stop layer, a pattern contact hole 75 is patterned through the pattern interlayer insulating layer 70 to expose the source pad 63.

Figure 14:
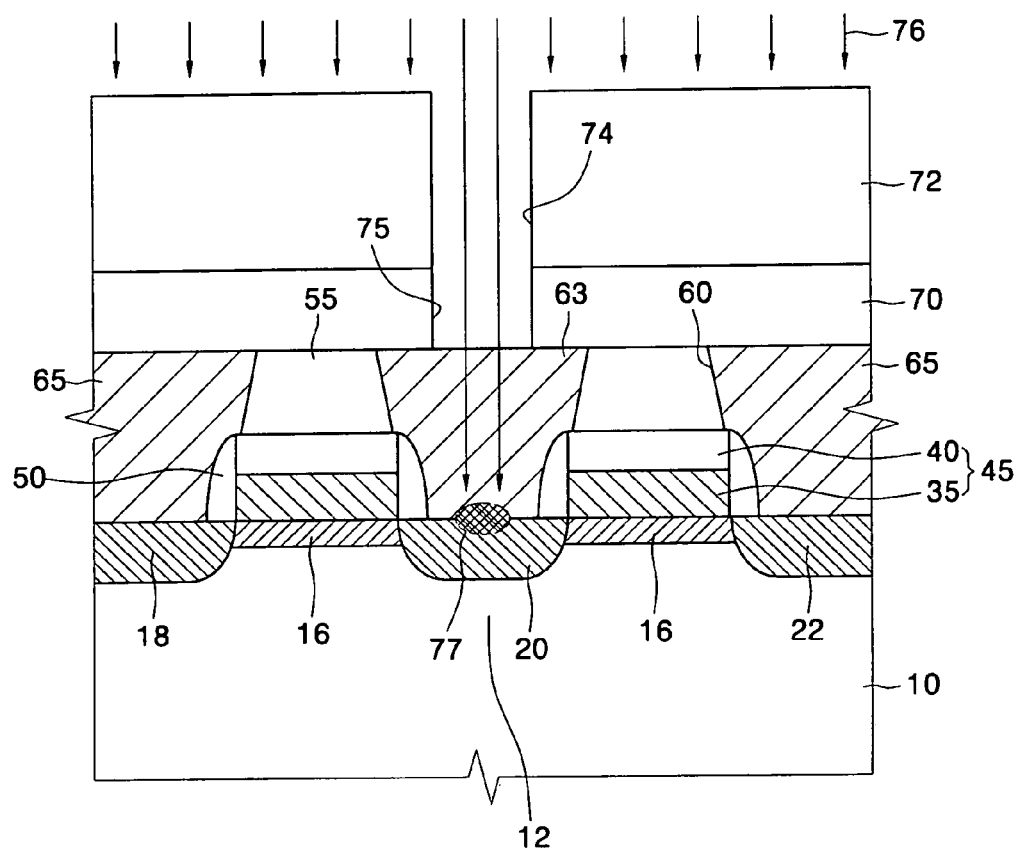

Referring to FIGS. 13 and 14, an ion implantation process 76 is performed for implanting a dopant through the pattern hole 74 and the pattern contact hole 75 to form a P-type impurity region 77 in the source pad 63. The photoresist layer 72 acts as an implantation mask during such an ion implantation process 76. The dopant for the P-type impurity region 77 is comprised of at least one of B or $BF_2$ with a dose that is smaller than an N-type dopant concentration of the source pad 63, in one embodiment of the present invention.

The ion implantation process 76 is performed with an implantation energy that results in the P-type impurity region 77 being disposed within the source pad 63, or near the top surface of the semiconductor substrate 10, or within the diffusion source region 20. The ion implantation process 76 is performed at a tilt angle of 0° with respect to a line normal to the semiconductor substrate 10, in one embodiment of the present invention.

After the ion implantation process 76, the photoresist layer 72 is removed from the semiconductor substrate 10. Alternatively, the ion implantation process 76 may be performed without the photoresist layer with the pattern interlayer insulating layer 70 acting as an implantation mask. In that case, the ion implantation process 76 is performed after removing the photoresist layer 72.

Figure 15:
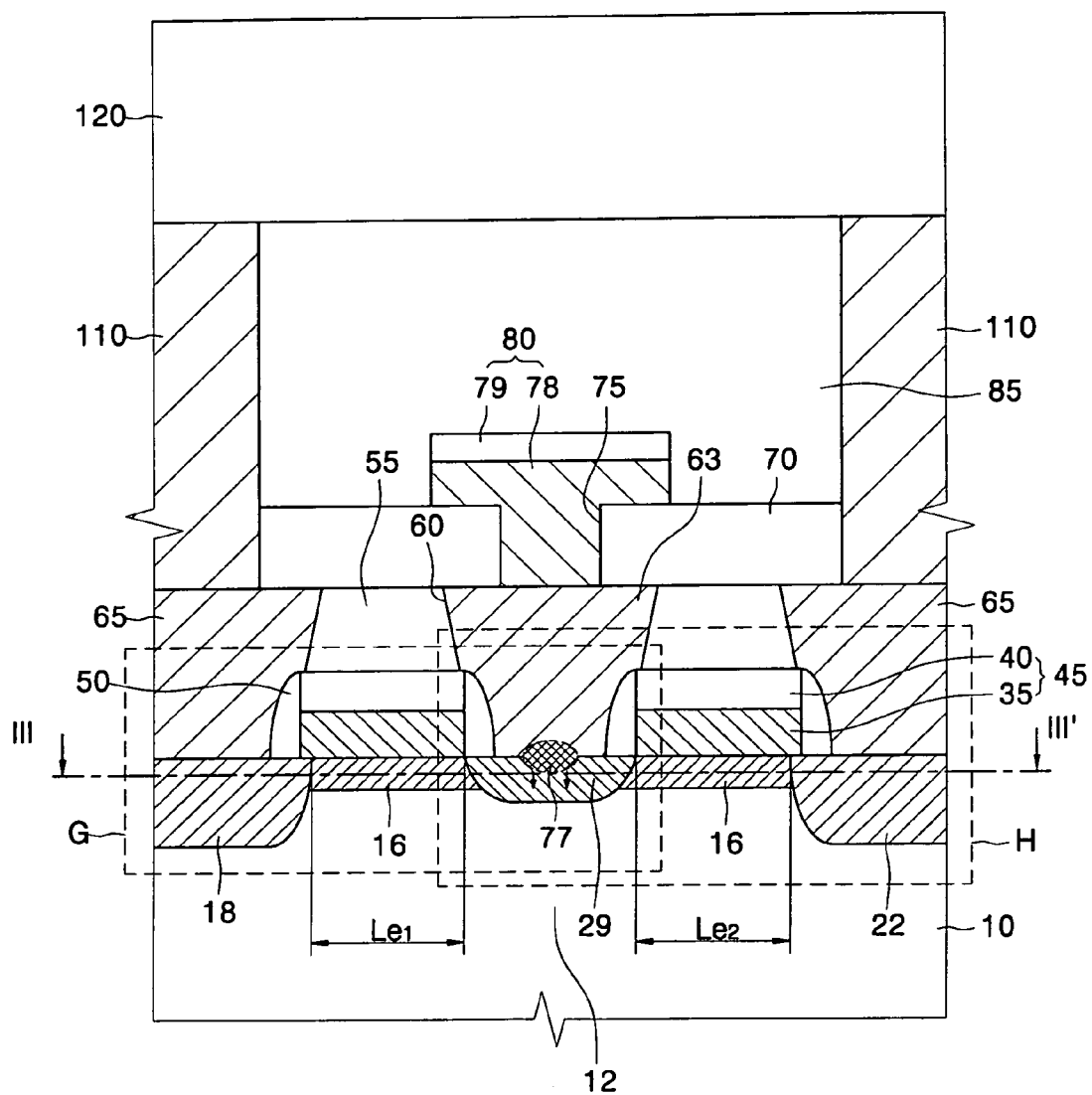

Referring to FIGS. 14 and 15, a source pattern 80 is formed on the pattern interlayer insulating layer 70 to fill the pattern contact hole 75. In addition, a buried interlayer insulating layer 85 is deposited to cover the source pattern 80 and the pattern interlayer insulating layer 70. Similar to FIG. 10, buried contact holes 95 are formed in FIG. 15 through the buried interlayer insulating layer 85 to expose the drain pads 65. Thereafter, drain patterns 110 are formed to fill the buried contact holes 95, and a diffusion interlayer insulating layer 120 comprised of at least one insulating material is blanket-deposited. Elements having the same reference number in FIGS. 10 and 15 refer to elements having similar structure and/or function.

However in FIG. 15, the P-type dopant from the P-type impurity region 77 diffuses into the source region 20 to form a source region 29, especially when the structures of FIG. 15 are heated up during the formation of the source and drain patterns 80, 110, the buried interlayer insulating layer 85, and the diffusion interlayer insulating layer 120. The addition of the P-type dopant reduces the majority N-type carrier concentration K of the initial source region 20 to a lower majority N-type charge carrier concentration R of the resulting source region 29.

In addition, the majority N-type charge carrier concentration R of the resulting source region 29 is lower than that of the drain regions 18, 22. Furthermore, the source region 29 has a shallower depth than the drain regions 18, 22. Thus, the source region 29 is asymmetric from each of the drain regions 18 and 22 resulting in the two asymmetric field effect transistors G and H of FIGS. 3 and 15, according to the second embodiment of the present invention. The two adjacent transistors G, H have effective channel lengths $L_{e1}$, $L_{e2}$, respectively, which are each shorter than the width of the gate stack 45. The effective channel lengths $L_{e1}$, $L_{e2}$ are substantially equal in one embodiment of the present invention.

Figure 16:
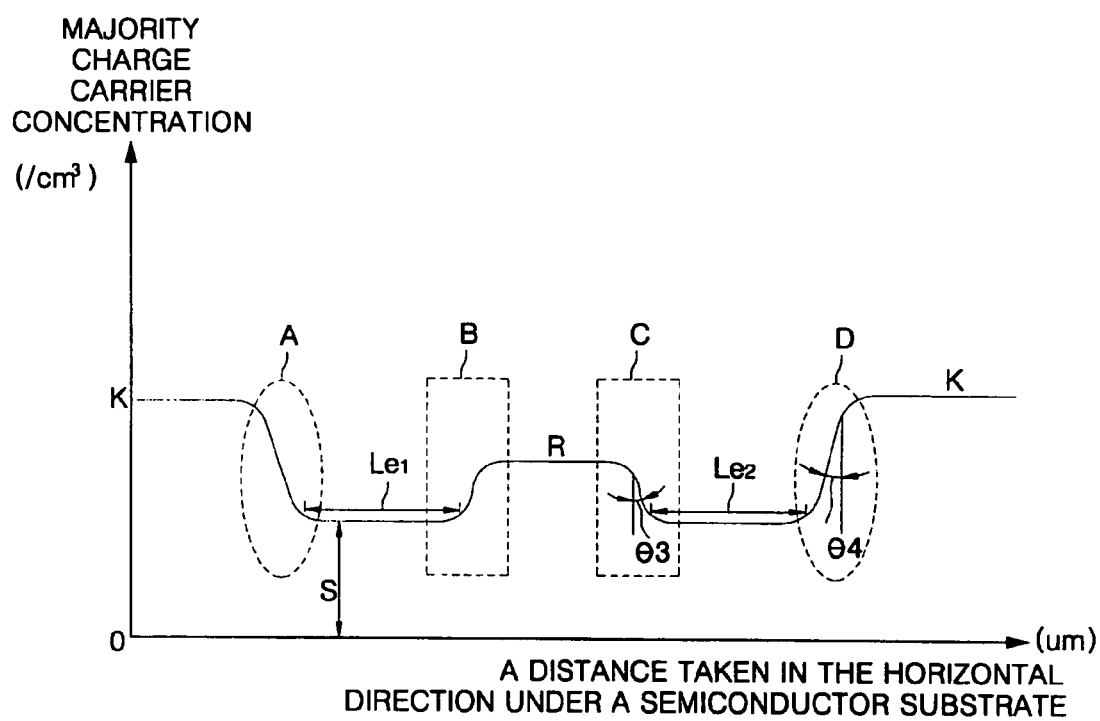
FIG. 16 is a profile of majority charge carrier concentration along line III–III' of FIG. 15.

FIG. 16 is a profile of majority charge carrier concentration along line III–III' of FIG. 15 including across the source and drain regions 29, 18, and 22 and the channel regions 16. The drain regions 18, 22 have a majority N-type charge carrier concentration K, and the source region 29 has a majority N-type charge carrier concentration R that is less than K. The channel regions 16 have a majority P-type charge carrier concentration S which is lower than K and R.

The portions A, B, C, and D in the profile of FIG. 16 are each an area of transition from one of the source and drain regions 29, 18, and 22 to a channel region 16 under a gate stack 45. Such portions A, B, C, and D each have a slope for transitioning between the different majority charge carrier concentrations. For example, in the portions A and D, the transition from concentration K to concentration S results in a slope of the profile forming an angle, $\theta_4$, with respect to the vertical axis. Alternatively, in the portions B and C, the transition from concentration R to concentration S results in a slope of the profile forming an angle, $\theta_3$, with respect to the vertical axis.

Because K is higher than R, the angle $\theta_4$ in the portions A and D (having a steeper slope) is smaller than the angle $\theta_3$ in the portions B and C. As a result, referring to FIGS. 15, 16, and 17, each of the drain regions 18, 22 has higher majority carrier concentration fully abutting the drain pad 65 coupled to the charge storage node 204 of the charge storage capacitor 200 for more efficient charge transfer between the field effect transistor G and the charge storage capacitor 200. In addition with such drain regions 18, 22 having higher majority carrier concentration abutting the drain pad 65, data charge stored in the capacitor 200 may be maintained longer.

Moreover, the majority N-type charge carrier concentration K of the drain regions 18, 22 in FIG. 15 for the second embodiment is less than the majority N-type charge carrier concentration J of the drain regions 24, 26 for the first embodiment. Thus, the angle $\theta_4$ in the portions A and D of FIG. 16 for the second embodiment is greater than the angle $\theta_2$ in the portions A and D of FIG. 11 for the first embodiment. Such more gradual slopes in the profile portions A and D of FIG. 16 for the second embodiment result in reduced charge leakage from the charge storage capacitor 200. Furthermore, the diffusion of the P-type dopant into the source region 29 from the P-type impurity region 77 results in increased threshold voltage of each of the transistors G, H which in turn also reduces charge leakage from the charge storage capacitor 200.

The foregoing is by way of example only and is not intended to be limiting. For example, the present invention has been described for using the asymmetric field effect transistors as part of a DRAM cell. However, the asymmetric field effect transistors may also be used within other types of integrated circuits. In addition, any materials or dimensions or parameter values specified herein are by way of example only. Furthermore, any numbers or shapes of structures illustrated and described herein are by way of example only.

The present invention is limited only as defined in the following claims and equivalents thereof.

What is claimed is:

1. A field effect transistor comprising:
    a channel region disposed under a gate stack within a semiconductor substrate;
    a drain region formed with a first dopant doping a first side of the channel region;
    a source region formed with the first dopant doping a second side of the channel region;
    wherein a first majority charge carrier profile between the channel region and the drain region has a steeper slope than a second majority charge carrier profile between the channel region and the source region;
    a source pad disposed on the source region; and
    an impurity region formed within at least a portion of the source pad with the impurity region being doped with a second dopant having opposite conductivity from the first dopant;
    wherein the second dopant from the impurity region diffuses to the source region to dope the source region.

2. The field effect transistor of claim 1, wherein the first dopant has N-type conductivity, and wherein the second dopant has P-type conductivity.

3. A memory cell, comprising:
    a charge storage node; and
    an access field effect transistor including:
        a channel region disposed under a gate stack within a semiconductor substrate;
        a drain region formed with a first dopant doping a first side of the channel region, wherein the drain region is coupled to the charge storage node;
        a source region formed with the first dopant doping a second side of the channel region;
        wherein a first majority charge carrier profile between the channel region and the drain region has a steeper slope than a second charge carrier profile between the channel region and the source region;
    a source pad disposed on the source region; and
    an impurity region formed within at least a portion of the source pad with the impurity region being doped with a second dopant having opposite conductivity from the first dopant;
    wherein the second dopant from the impurity region diffuses to the source region to dope the source region.

4. The memory cell of claim 3, wherein the first dopant has N-type conductivity, and wherein the second dopant has P-type conductivity.

5. The field effect transistor of claim 1, further comprising:
    a drain pad disposed on the drain region; and
    an impurity region within the drain pad with the impurity region being doped with the first dopant;
    wherein the first dopant from the impurity region diffuses to the drain region to further dope the drain region.

6. The field effect transistor of claim 5, wherein the drain pad is coupled to a charge storage node of a capacitor of a DRAM (dynamic random access memory) cell.

7. The field effect transistor of claim 1, wherein the drain region is coupled to a charge storage node of a capacitor of a DRAM (dynamic random access memory) cell.

8. The field effect transistor of claim 1, wherein the drain region is larger than the source region.

9. The field effect transistor of claim 1, wherein the channel region is doped with a second dopant having opposite conductivity from the first dopant.

10. The memory cell of claim 3, wherein the access field effect transistor further includes:
    a drain pad disposed on the drain region; and
    an impurity region within the drain pad with the impurity region being doped with the first dopant;
    wherein the first dopant from the impurity region diffuses to the drain region to further dope the drain region.

11. The memory cell of claim 10, wherein the drain pad is coupled to the charge storage node that is for a capacitor of a DRAM (dynamic random access memory) cell.

12. The memory cell of claim 3, wherein the drain region is larger than the source region.

* * * * *